United States Patent
Tashiro et al.

[11] Patent Number: 6,121,620
[45] Date of Patent: *Sep. 19, 2000

[54] RADIATION DETECTOR AND PROCESS FOR ITS PRODUCTION

[75] Inventors: Kazuaki Tashiro, Hadano; Keiichi Kawasaki, Tokyo; Tatsumi Shoji, Hiratsuka; Ichiro Tanaka; Tatsuya Yamazaki, both of Utsunomiya, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/801,854

[22] Filed: Feb. 21, 1997

[30] Foreign Application Priority Data

Feb. 22, 1996 [JP] Japan .................................. 8-034903

[51] Int. Cl.[7] .......................... H01L 31/0232; G01T 1/20
[52] U.S. Cl. ....................................................... 250/370.11
[58] Field of Search ........................................ 250/370.11

[56] References Cited

U.S. PATENT DOCUMENTS 5,132,539 7/1992 Kwasnick et al. .................. 250/361 R

FOREIGN PATENT DOCUMENTS

| 0660421 | 6/1995 | European Pat. Off. . |
| 660421 A2 | 6/1995 | European Pat. Off. . |
| 1-245182 | 9/1989 | Japan ............................... 250/370.11 |

*Primary Examiner*—Constantine Hannaher
*Attorney, Agent, or Firm*—Fitzpatrick, Cella, Harper & Scinto

[57] ABSTRACT

A large-area, compact and highly reliable radiation detector is produced by a process comprising the steps of laminating a phosphor sheet to a substrate having at least a photoelectric transducer, a driving element and a wiring matrix, and sealing the phosphor sheet and substrate thus laminated, by imparting a sealing medium to at least part of the peripheral portions of the phosphor sheet and the substrate, at least one of the steps being carried out in a vacuum chamber, to thereby bring the phosphor sheet into close contact with the substrate by atmospheric pressure.

77 Claims, 8 Drawing Sheets

FIG. 4
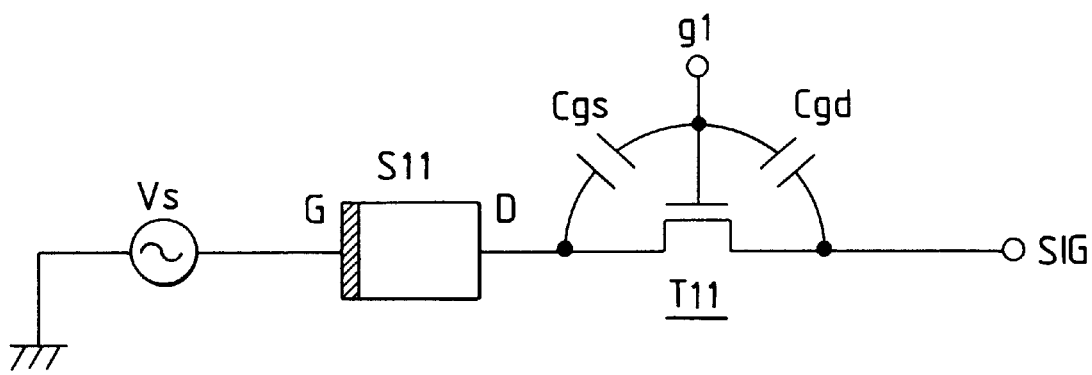
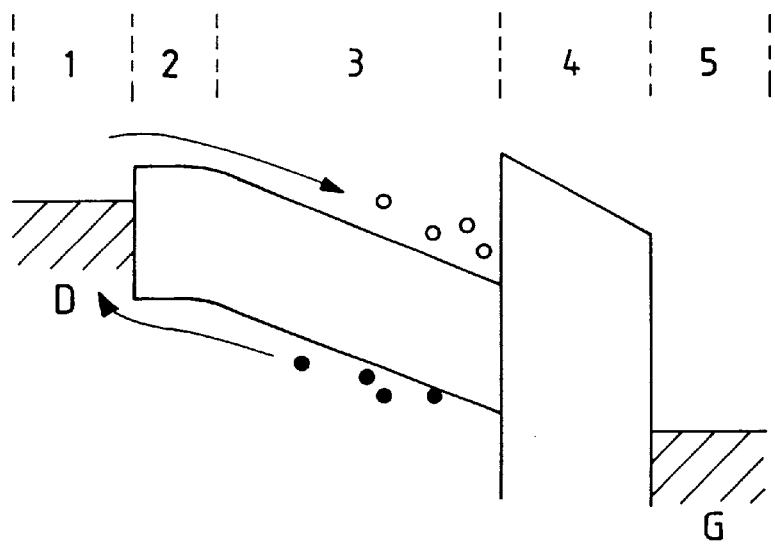
FIG. 5A
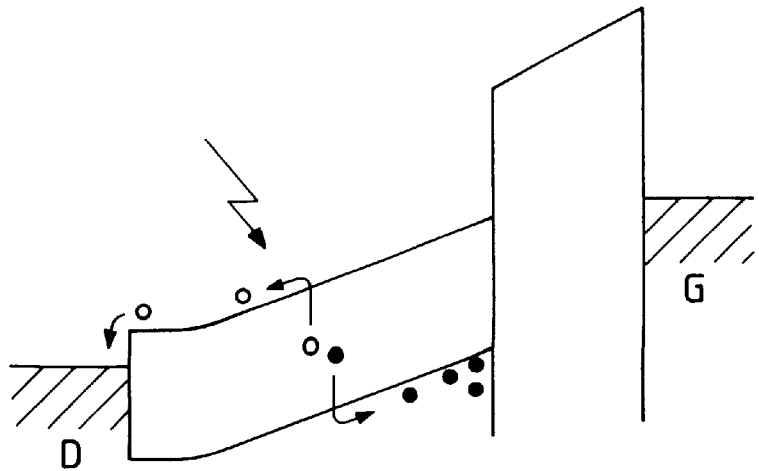
FIG. 5B

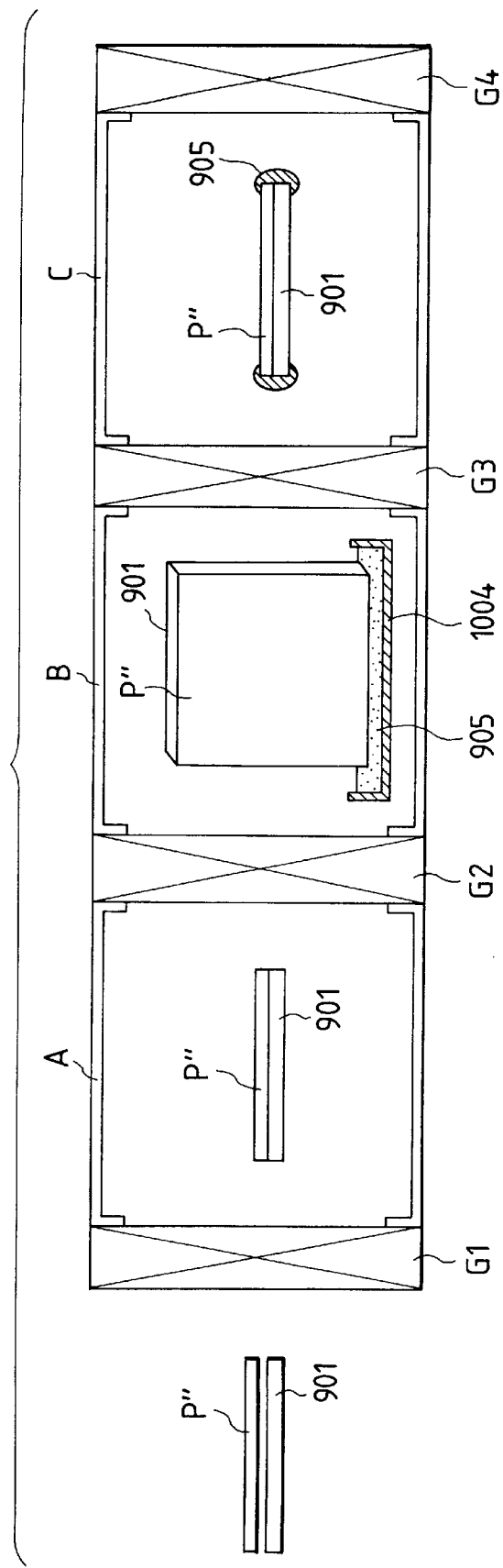

RADIATION DETECTOR AND PROCESS FOR ITS PRODUCTION

BACKGROUND OF THE INVENTION

1. Field of the invention

This invention relates to a radiation detector and a process for its production. More particularly, it relates to a radiation detector having at least i) a wavelength converter as typified by a phosphor (fluorescent substance) that converts radiation such as α-rays, β-rays, γ-rays and X-rays into light of a desired wavelength range, such as visible light; and ii) a photoelectric transducer having a sensitivity to the light thus converted, and also relates to a process for its production.

2. Related Background Art

Radiation detectors have been utilized in a variety of fields. Radiation detectors that utilize X-rays among various radiations are widely applied and developed in medical instruments, chemical analyzers and nondestructive inspection instruments. Typical apparatus having been put into practical use include, e.g., chest and stomach X-ray diagnostic apparatus, X-ray tomographs, circulatory organ X-ray diagnostic apparatus, X-ray fluoroscopes, X-ray diffraction apparatus, X-ray nondestructive inspection apparatus, and X-ray residual-stress analyzers.

As detecting elements in these apparatus, it is common to use, e.g., those employing X-ray films, those employing gas detectors, those comprised of combination of a phosphor with a photomultiplier, and those comprised of combination of an image intensifier with a film camera or television camera.

In recent years, in order to make apparatus compact and to make them digital to permit combination with image processing, developing detectors comprised of a combination of a phosphor with a solid photoelectric transducer is desired. Detectors are highlighted which employ imaging plates as substitutes for films, or which employ CCD solid image pickup devices as substitutes for analog television cameras. In these devices, the image information detected can be handled as digital signals in accordance with electric signals that carry the information. Hence, image data can be analyzed or processed with ease, thus the radiation detectors have a high performance.

However, no animation can be made when the imaging plates are used. When the CCD camera system is employed, imaging intensifiers are so bulky that the apparatus cannot be easily made compact. Especially in medical instruments, radiation detectors adaptable to large areas are needed. For example, in chest X-ray fluoroscopes, a large area of at least 46 cm square must be ensured. Accordingly, developing a radiation detector that can detect radiations over a large area, and at the same time can make the apparatus itself compact and is adaptable to animation is desired. For example, use of an amorphous silicon hydride highly sensitive photoelectric transducer as the photoelectric transducer makes the detector adaptable to large areas with ease. Moreover, combination of such a device with a phosphor enables one-to-one direct detection of large-area radiations with high sensitivity without providing any optical reduction system or image intensifier between them. Hence, it is possible to obtain a large-area, compact and animation-adaptable radiation detector. For example, one may contemplate combining a two-dimensional photoelectric transducer as disclosed in European Patent Publication No. 0660421, with a phosphor.

In the large-area radiation detector as described above, a phosphor sheet coated with a phosphor is bonded to a substrate having a photoelectric transducer, the former being bonded to the latter over its whole area by the use of an adhesive. FIG. 1 diagrammatically illustrates a cross-section of an example of such a radiation detector. In FIG. 1, reference numeral 1101 denotes a glass substrate; 1102, a layer provided with photoelectric transducers and so forth; 1103, an impurity preventive layer formed of polyimide or the like; 1104, an epoxy type adhesive; 1105, a phosphor protective layer; 1106, a phosphor; and 1107 a base sheet.

Now, some problems may occur when such a radiation detector is made large-area or the phosphor and the photoelectric transducer are integrated. More specifically, a problem may arise such that the difference in coefficient of thermal expansion between the glass substrate and the phosphor sheet or adhesive becomes significant to cause cracks in the phosphor sheet or deflection of the substrate.

Another problem may occur such that it is difficult to form a uniform adhesive layer over the whole substrate surface and it is difficult to keep uniform the flatness of the phosphor sheet, so that impurities in the adhesive may adversely affect the phosphor or the underlying devices. Hence, it may be required to further add a protective film. Namely, this results in addition of a component between the phosphor sheet and the substrate.

The support member of a base sheet used has a thickness of about 1 mm in order to ensure an appropriate strength and a uniform flatness. In usual instances, the base sheet is formed using an aluminum plate having a high X-ray transmittance, which also serve as a plate for reflecting light produced in the phosphor. Hence, the whole radiation detector tends to be heavy-weight.

Another problem may occur such that a useless gap is formed between the photoelectric transducer and the phosphor because of the protective film of the phosphor sheet, adhesive layer and so forth, resulting in a decrease in utilization of light and causing blurred images because of scattering of light that occurs there. Especially in the case of medical instruments, it is required to limit radiation doses to human bodies. Also, the conversion efficiency of the phosphor, as conversion of radiant energy into light, is about 10%. Thus, under conditions that the light should be effectively utilized as far as possible, such a decrease in efficiency may become problematic.

In addition, the phosphor has a moisture absorption and most phosphors deteriorate upon absorption of water, thus the phosphor may adversely affect devices concurrently because of the moisture absorption of the adhesive.

More specifically, as stated above, as the area of the radiation detector is increased or the phosphor and the photoelectric transducer are integrated, it has become necessary to take the following points into account.

(1) Cracking of the phosphor sheet and deflection of the substrate, caused by the difference in coefficient of thermal expansion between the glass substrate and the phosphor sheet or adhesive;

(2) The formation of a uniform adhesive layer over the whole substrate surface, and the flatness of the phosphor sheet;

(3) The effect of impurities in the adhesive upon the phosphor and underlying devices;

(4) The component between the phosphor sheet and the substrate;

(5) The weight of the whole radiation detector;

(6) The gap formed between the photoelectric transducer and the phosphor because of the protective film of the phosphor sheet, adhesive layer and so forth, the utilization of light, and the blurred images caused by scattering of light; and (7) The moisture absorption of the phosphor, the deterioration of the phosphor upon absorption of water, and the moisture absorption of the adhesive.

SUMMARY OF THE INVENTION

The present invention was made taking account of these points, and provides a radiation detector, and a a process for its production, that can solve the problems discussed above.

Accordingly, an object of the present invention is to provide a radiation detector that can be free from cracking of phosphor sheets and deflection of substrates, and has a phosphor sheet with a uniform flatness, and a process for its production.

Another object of the present invention is to provide a radiation detector so made up that any impurities in an adhesive do not adversely affect phosphors and underlying devices, and a process for its production.

Still another object of the present invention is to provide a radiation detector that does not make the whole apparatus heavy-weight and can make it compact and light-weight, and a process for its production.

A further object of the present invention is to provide a radiation detector that may cause no useless gap between the photoelectric transducer and the phosphor, has a high adhesion between them, has a high utilization of light and may cause no blurred images due to scattering, and a process for its production.

A still further object of the present invention is to provide a radiation detector having superior environmental properties including humidity resistance, and a process for its production.

To achieve the above objects, the present invention provides a radiation detector comprising a substrate having at least a photoelectric transducer, and a wavelength converter provided on the substrate;

the wavelength converter being brought into pressure contact with the substrate by atmospheric pressure.

The present invention also provides a radiation detector comprising a substrate having at least a photoelectric transducer, and a phosphor sheet formed on the substrate by lamination, wherein;

the phosphor sheet is brought into close contact with the substrate at their interface by atmospheric pressure.

The present invention still also provides a process for producing a radiation detector, comprising the steps of;

bringing a substrate having at least a photoelectric transducer, into contact with a wavelength converter under a pressure lower than atmospheric pressure;

while keeping the state of contact between them, sealing the substrate and the wavelength converter at their edge face portions inclusive of the interface between them; and subsequently placing under atmospheric pressure the substrate and wavelength converter thus sealed.

The present invention further provides a process for producing a radiation detector by laminating a phosphor sheet to a substrate having at least a photoelectric transducer, wherein;

the substrate and phosphor sheet laminated are sealed while bringing them into contact at their interface under a pressure lower than atmospheric pressure.

BRIEF DESCRIPTION OF THE DRAWINGS

FIG. 4 is a schematic illustration of an equivalent circuit of the pixel.

FIGS. 5A and 5B are schematic views of energy bands, to illustrate an example of the operation of a photoelectric transducer.

FIGS. 7A, 7B, 7C, 9A, 9B, 9C and 11 are views to illustrate steps through which the phosphor serving as a wavelength converter in the present invention is provided, in which FIGS. 7A, 7B, 7C and 9C are diagrammatic perspective views, and FIGS. 9A, 9B and 11, diagrammatic cross-sections.

DESCRIPTION OF THE PREFERRED EMBODIMENTS

The present invention will be described below in detail with reference to the accompanying drawings.

FIRST EMBODIMENT

Figure 1:
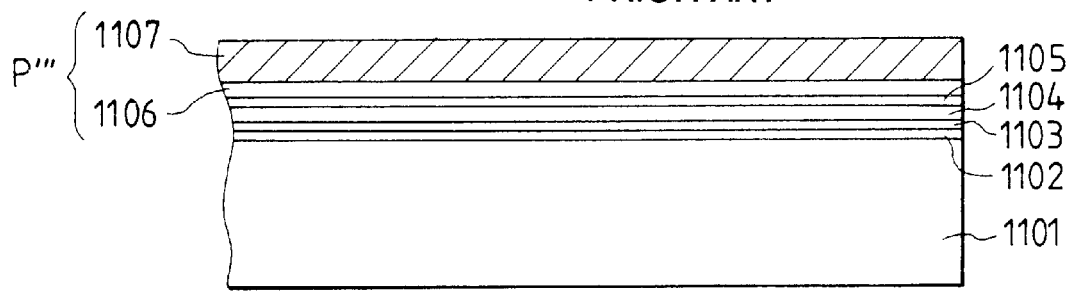
FIG. 1 is a diagrammatic cross-section showing an example of a radiation detector having an adhesive layer to provide a phosphor.
Figure 2:
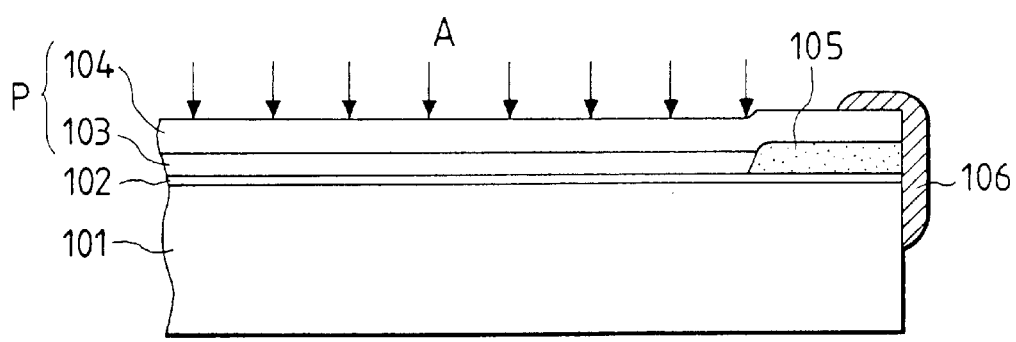
FIGS. 2, 8 and 10 are diagrammatic cross-sections showing examples of the radiation detector according to the present invention.

As a first embodiment of the radiation detector according to the present invention, FIG. 2 shows a diagrammatic cross-section of a two-dimensional radiation detector. In FIG. 2, reference numeral 101 denotes a glass substrate; 102, a layer of photoelectric transducers and so forth (the photoelectric transducers, thin-film transistors and so forth are omitted from illustration); 103, a phosphor; 104, a base sheet of the phosphor; P (letter symbol), a phosphor sheet; 105, a thermosetting resin serving as an adhesive seal member; and 106, a sealing medium. Letter symbol A denotes atmospheric pressure, which brings the phosphor sheet into close contact with the surface of the layer of photoelectric transducers and so forth.

Figure 3A:
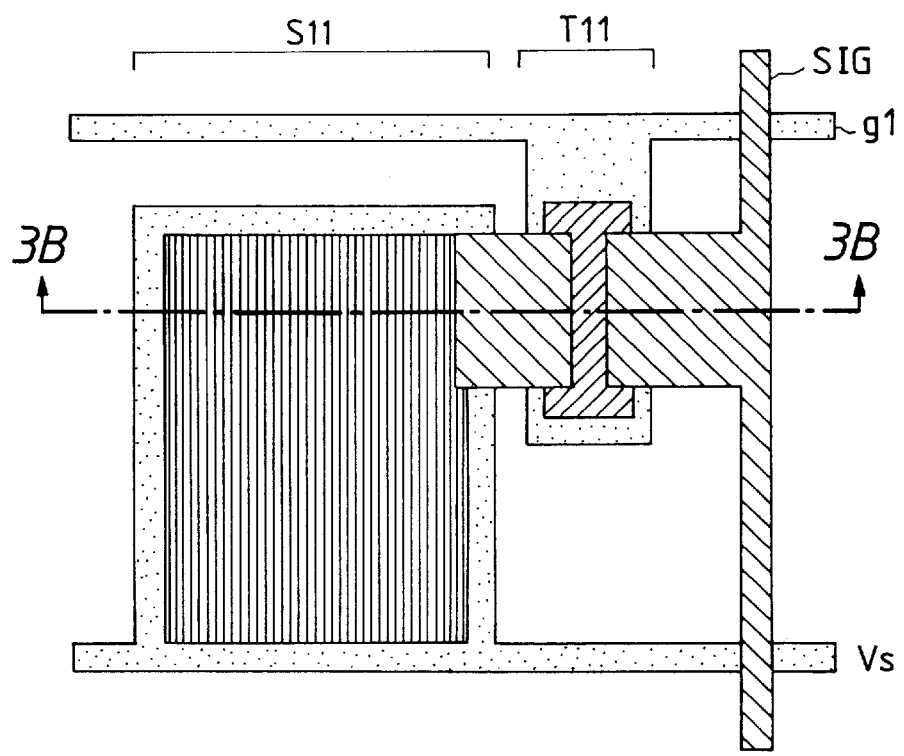
FIG. 3A is a diagrammatic plan view of a picture element (pixel) of the radiation detector, applicable in the present invention.
Figure 3B:
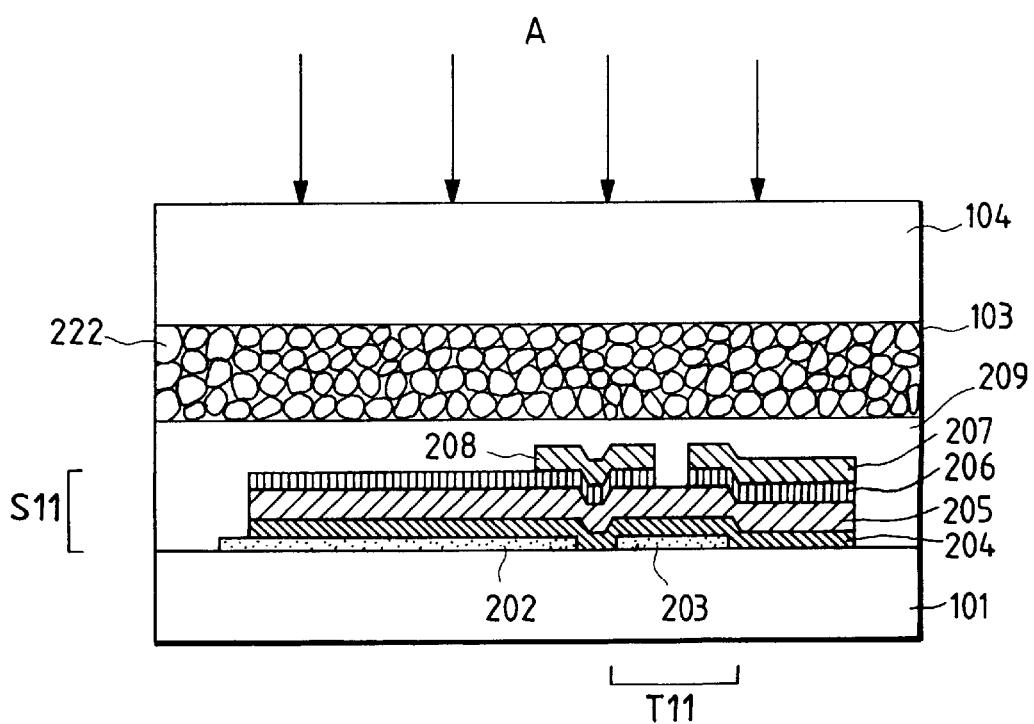
FIG. 3B is a diagrammatic cross-section of the pixel shown in FIG. 3A.

FIG. 3A shows a diagrammatic plan view of a portion corresponding to one pixel of the radiation detector. FIG. 3B shows a diagrammatic cross-section along the line 3B—3B in FIG. 3A. Reference numeral 101 denotes the glass substrate; 202, a lower electrode of an MIS type photosensor formed of chrome metal; 203, a gate electrode of the thin-film transistor; 204, an amorphous silicon hydride nitride layer; 205, an amorphous silicon hydride layer; 206, an n$^+$-type microcrystalline silicon layer; 207 a source of the thin-film transistor; 208, a drain electrode; 209, an amorphous silicon hydride nitride layer serving as a surface protective layer; 103, the phosphor; and 104, the base sheet. Letter symbol A denotes the atmospheric pressure. The photoelectric transducer used in the present invention is constituted in the same layer together with the thin-film transistor and a wiring matrix, and can be formed on the same substrate by the same process. Hence, a large-area substrate can be processed through a smaller number of steps, thus the device can be produced in a good yield.

X-rays which are incident on the phosphor sheet from the outside undergo wavelength conversion here, and their energy is converted into light of wavelengths to which the photoelectric transducer is sensitive. This light is detected by the photoelectric transducer. According to the present embodiment, as shown in FIG. 2 or FIGS. 3A and 3B, only a 5,000 angstroms thick protective layer 209 is present between the phosphor 103 and a photoelectric transducer S11, and the light produced in the phosphor can efficiently reach the photoelectric transducer. The phosphor sheet P can also be brought into close contact with the surface of the layer of photoelectric transducers and so forth in a precision within 1 μm. The phosphor sheet P and the glass substrate 101 are perfectly sealed with the sealing medium 106 at their edge face portions to prevent outside moisture or the like from entering. Between the phosphor sheet and the layer of photoelectric transducers and so forth, any impurity-containing component such as an adhesive is not present, except for the lamination edges. Hence, not only the phosphor but also the underlying devices such as photoelectric transducers cause almost no deterioration.

In the present embodiment, to prepare the phosphor sheet P, phosphor powder ($CaWO_4$) with a particle diameter of about 5 μm, was mixed in an aqueous polyvinyl alcohol solution to form a slurry. This slurry was coated on a polyimide sheet, followed by drying, to form a phosphor layer with a thickness of 200 μm.

In the present example, the polyimide sheet is used as the base sheet. A synthetic resin sheet such as a polyethylene sheet, capable of transmitting X-rays, may also be used. In order to improve utilization of light, a resin sheet may also be used on which aluminum has been deposited in a thickness of about 1,000 angstroms.

FIG. 4 schematically illustrates an equivalent circuit of one pixel of the radiation detector as shown in FIGS. 3A and 3B. As shown in FIG. 4, one pixel has an MIS type photosensor S11 as a photoelectric transducer, and a driving thin-film transistor T11 as a photoelectric transducer driving element. SIG denotes signal wiring; g1 [gn (n=1)], a gate line of the driving thin-film transistor; and D and G, an upper electrode and a lower electrode, respectively, of the MIS sensor. Cgs and Cgd are each capacitance formed by superimposing the gate electrode and source electrode or drain electrode of the driving thin-film transistor. Electric charges generated by light in the sensor S11 are stored in the Cgs and Cgd through the thin-film transistor, and thereafter the electric charges are read through a readout circuit (not shown). An instance for 1 bit is shown here. In practice, the Cgs and Cgd correspond to the sum total of those of other thin-film transistors connected to this gate line. The stored capacitance utilizes the Cgs and Cgd.

In the present embodiment, the photoelectric transducer as disclosed in European Patent Publication No. 0660421 may be used. The driving of the photoelectric transducer will be outlined below.

FIGS. 5A and 5B are schematic views of energy bands of the photoelectric transducer, to respectively illustrate how a refresh mode and a photoelectric conversion mode operate. In the drawings, numerals 1 to 5 indicate the state of the respective layers in their thickness direction.

In the refresh mode shown in FIG. 5A, once a potential which is negative with respect to an electrode G is imparted to an electrode D, holes shown by black dots, present in the amorphous silicon hydride layer 3, are guided to the electrode D by the aid of an electric field. At the same time, electrons shown by white dots are injected into the amorphous silicon hydride layer 3. Here, some holes and electrons recombine in the $n^+$-type microcrystalline silicon layer 2 and amorphous silicon hydride layer 3 to disappear. When this state continues for a well long time, the holes in the amorphous silicon hydride layer 3 are swept out of the amorphous silicon hydride layer 3.

Once in this state, the device has turned into the photoelectric conversion mode as shown in FIG. 5B, a potential which is positive with respect to the electrode G is imparted to the electrode D, and hence the electrons in the amorphous silicon hydride layer 3 are instantaneously guided to the electrode D. Since, however, the $n^+$-type microcrystalline silicon layer 2 acts as an injection blocking layer against the holes, the holes are by no means guided into the amorphous silicon hydride layer 3. Once in this state the light is incident and enters the amorphous silicon hydride layer 3, the light is absorbed and hole-electron pairs are generated. These electrons are guided to the electrodes by the aid of an electric field, and the holes move inside the amorphous silicon hydride layer 3 to reach the interface of the amorphous silicon hydride nitride layer 4 but are stopped moving at this interface, so that the holes stay in the amorphous silicon hydride layer 3. Thus, the electrons move to the electrode D and the holes move to the interface of the amorphous silicon hydride nitride layer 4 in the amorphous silicon hydride layer 3, so that an electric current flows from the electrode G in order to keep electrical neutrality in the device. This electric current corresponds to the hole-electron pairs generated by light, and hence is proportional to the incident light. This photoelectric transducer has a high sensitivity and also can ensure a broad dynamic range, thus being promising for use in radiation detection.

Figure 6:
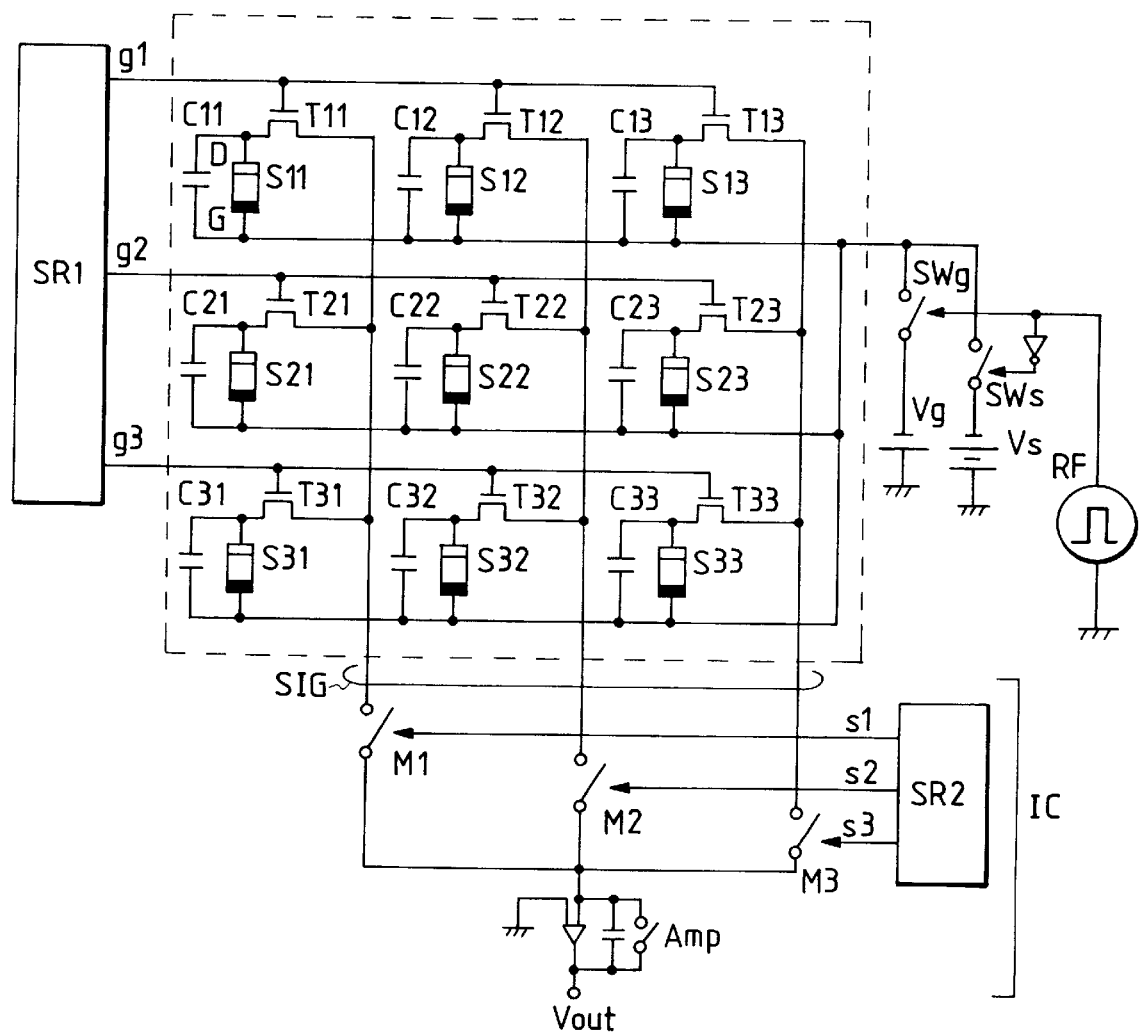
FIG. 6 is a schematic view of the whole circuit construction of a preferred radiation detector of the present invention.

FIG. 6 illustrates the whole circuit construction of the radiation detector. In FIG. 6, S11 to S33 denote photoelectric transducers. T11 to T33 denote thin-film transistors for driving photosensors. Vs denotes a readout electrode, and Vg a refresh electrode, which are connected to the lower electrodes G of all the photoelectric transducers S11 to S33 through switches SWs and SWg, respectively. The switch SWs is connected to a refresh control circuit RF through an inverter, and the switch SWg directly, and are so controlled that the switch SWg is ON during the refresh period and the switch SWs is ON during the other period. Signal outputs are connected to a detecting integrated circuit IC through a signal wiring SIG.

In the circuit shown in FIG. 6, nine pixels are grouped into three blocks, where outputs for three pixels per each block are simultaneously transmitted, and corresponding signals are successively converted into outputs by the detecting integrated circuit to make output. A two-dimensional radiation detector with nine pixels is illustrated here so as to be described with ease. Actually the apparatus is constituted of pixels in a higher density. For example, when a radiation detector of 46 cm square is produced in a pixel size of 150 μm square, the number of pixels reaches about 1,800,000.

Of course, the photoelectric transducers are by no means limited to those constituted as described above. In view of easy production and high yield, however, those constituted as described above are preferred because the layers can be constituted in the same order as the transistors, and so forth.

Figure 7A:
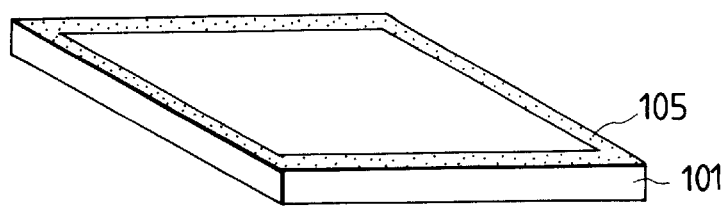
Figure 7B:
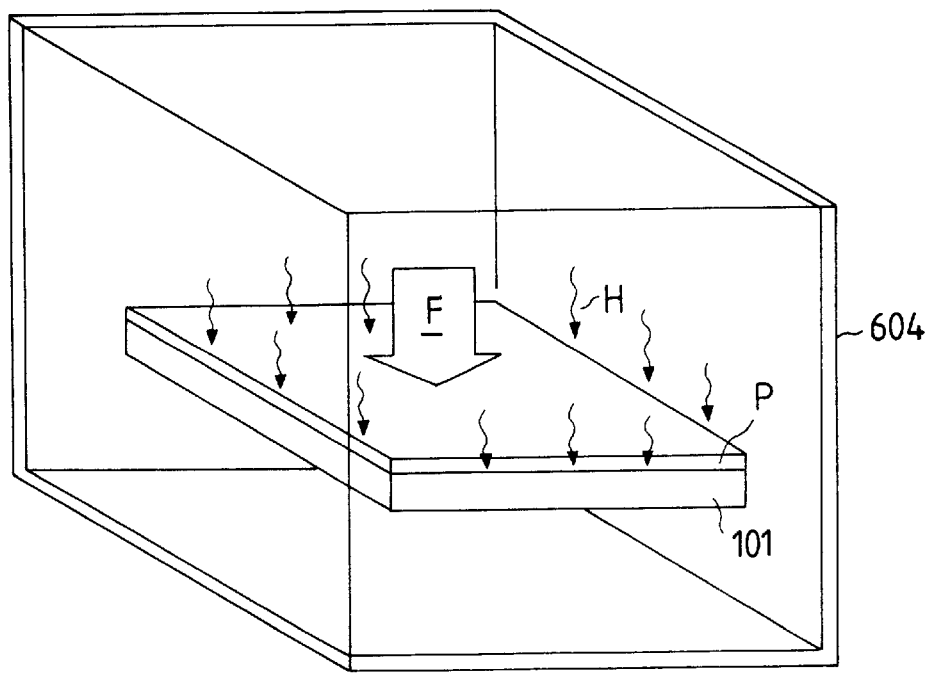
Figure 7C:
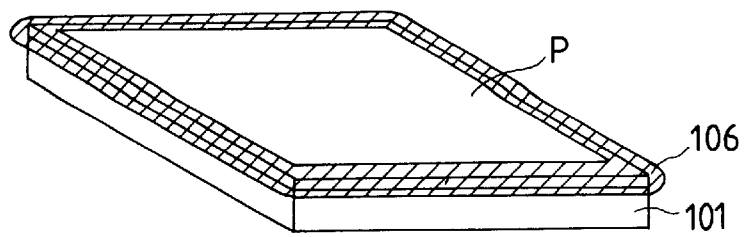

The step of laminating the phosphor sheet to the substrate on which the photoelectric transducers and so forth have been formed and the subsequent steps, which are in accordance with the present embodiment, are shown in FIGS. 7A to 7C.

As shown in FIGS. 7A to 7C;

a) a thermosetting resin as an adhesive is screen-printed to lamination edges 105 along the periphery of the glass substrate 101 on which the photoelectric transducers and so forth have been formed. The thermosetting resin is printed in a thickness of, e.g., 250 μm. As the adhesive, an adhesive having an elasticity and also a high adhesion is preferable. That is, an adhesive that can firmly bond the phosphor sheet to the substrate and at the same time can well absorb the difference in thermal expansion or the like is preferable. The thermosetting resin includes phenol resins, resorcinol resins, urea resins, melamine resins, furan resins, epoxy resins, unsaturated polyester resins and silicone resins, any of which may be used to achieve the purpose of the present invention. The lamination edges have a width of, e.g., 1 mm. The photoelectric transducers and so forth are formed at the inner part surrounded by these lamination edges. Next, the phosphor sheet P (not shown) is made ready for use. The phosphor sheet P also has lamination edges with a like width of 1 mm. (FIG. 7A)

b) Next, the substrate and phosphor sheet are set to their respective holders (not shown) in a vacuum chamber 604 standing open to the atmosphere. Here, the glass substrate on which the photoelectric transducers and so forth have been formed and the phosphor sheet are previously registered (positionally adjusted) so that they can overlap well with one another when brought into contact. The phosphor sheet has a base sheet comprised of a polyimide sheet, and it is carefully set to the holder to ensure its flatness.

Use of a base sheet having an appropriate rigidity enables preferable close contact of the phosphor sheet by atmospheric pressure. Use of a base sheet having a high rigidity such as an aluminum sheet, may on the other hand, make it difficult to achieve perfect close contact with the substrate by atmospheric pressure. Hence, when such a base sheet is used, it is preferable to control its thickness or the like to adjust the rigidity.

Thereafter, the vacuum chamber is evacuated by means of a vacuum pump (not shown). In this state, the resin is vacuum-deaerated. Thereafter, the holders are moved so that the phosphor sheet is brought into close contact with the glass substrate on which the photoelectric transducers and so forth have been formed. While applying a pressure F, heat H is partly applied using a heater, and while the resin is thereby made viscous, they are contact-bonded. (FIG. 7B)

c) After cooling, they are taken out to the atmosphere, whereupon the phosphor sheet P is pressed by the atmospheric pressure and brought into perfectly close contact with the surface of the glass substrate on which the photoelectric transducers and so forth have been formed. In this state, the phosphor sheet and the glass substrate on which the photoelectric transducers and so forth have been formed are sealed with a polyamide resin 106 at their edge face portions so their interface is covered. As a sealing medium, a thermoplastic resin having an elasticity is preferred. The thermoplastic resin includes vinyl acetate resins, acrylic resins, styrene resins, cellulose resins, polyamide resins, alkyd resins, and monomer type cyanoacrylate resins, any of which may be used to achieve the purport of the present invention. (FIG. 7C)

Only a single vacuum chamber is employed as an apparatus used in the above steps. In actual manufacture, it is preferred to use an apparatus employing a plurality of vacuum chambers in combination. Holders may also be provided to be taken out of the vacuum chambers, and a plurality of phosphor sheets and a plurality of glass substrates on which the photoelectric transducers and so forth have been formed and to which the thermosetting resin has been applied may be simultaneously set to the holders, which may be put into the vacuum chambers so that a plurality of sheets and substrates can be simultaneously processed.

Using the constitution and process of the present embodiment, large-area radiation detectors of 46 cm square were produced. As a result, the problems as previously stated did not occur at all.

SECOND EMBODIMENT

Figure 8:
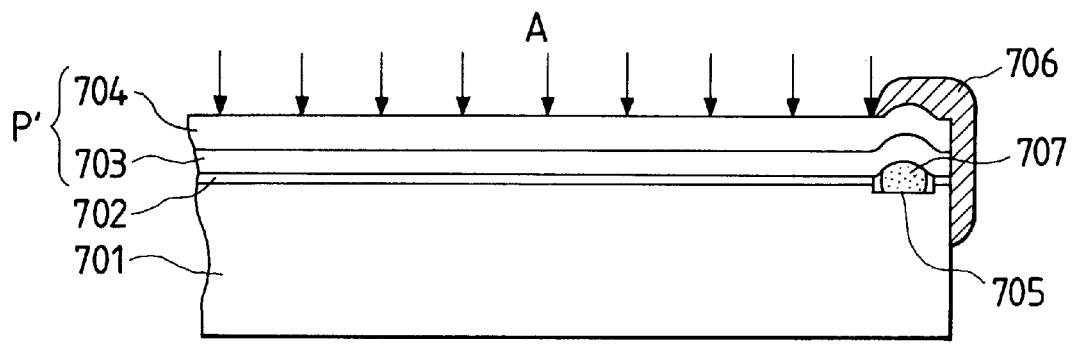

As a second embodiment of the radiation detector according to the present invention, FIG. 8 shows a partial diagrammatic cross-section of a two-dimensional radiation detector, which also illustrates edge face portions of the substrate and phosphor sheet. Reference numeral 701 denotes a glass substrate; 702, a layer of photoelectric transducers and so forth (the photoelectric transducers, thin-film transistors and so forth are omitted from illustration); 703, a phosphor; 704, a base sheet of the phosphor; P' (letter symbol), a phosphor sheet; 705, a cutout which forms a concave; 706, a sealing medium; and 707, an elastic member. Letter symbol A denotes atmospheric pressure, which brings the phosphor sheet into close contact with the surface of the layer of photoelectric transducers and so forth.

According to the present embodiment, only a 5,000 angstroms thick protective layer is present between the phosphor and the photoelectric transducer, and the light produced in the phosphor can efficiently reach the photoelectric transducer. The phosphor sheet can also be brought into close contact with the surface of the layer of photoelectric transducers and so forth in precision within 1 μm. The phosphor sheet and the glass substrate are perfectly sealed with the sealing medium 706 at their edge face portions to prevent outside moisture or the like from entering. Between the phosphor sheet P' and the layer of photoelectric transducers and so forth, any impurity-containing component such as an adhesive is not present at all, except for the lamination edges. Hence, not only the phosphor but also the underlying devices such as photoelectric transducers may cause almost no deterioration.

Figure 9A:
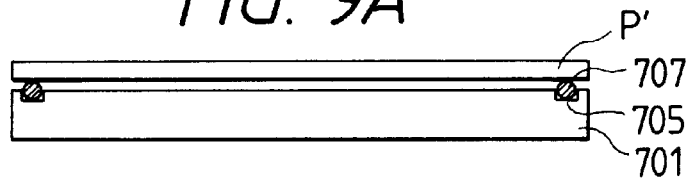
Figure 9B:
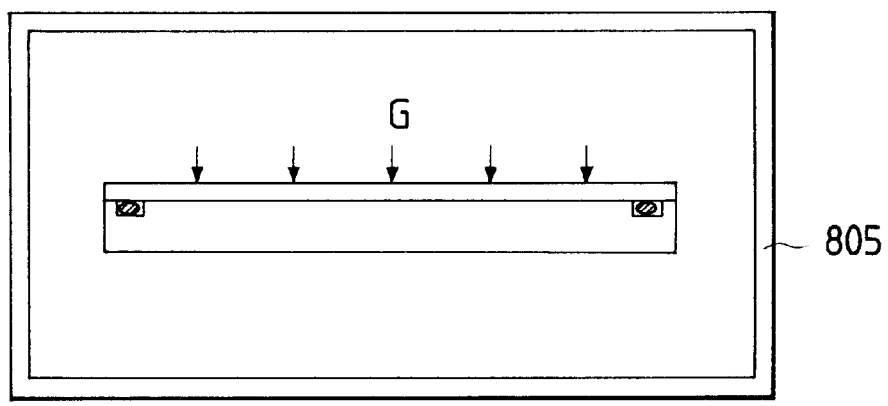
Figure 9C:
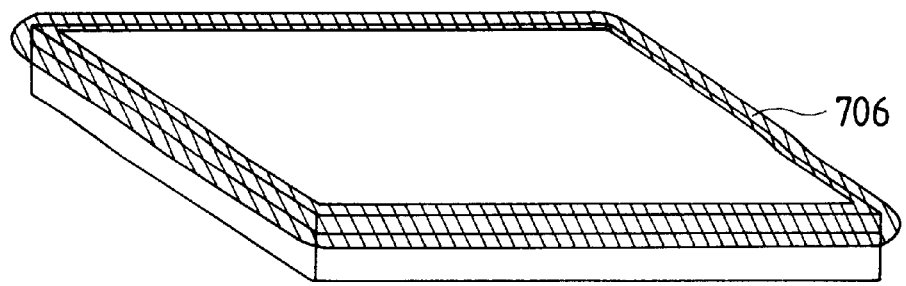

The step of laminating the phosphor sheet to the substrate on which the photoelectric transducers and so forth have been formed and the subsequent steps, which are in accordance with the present embodiment, are shown in FIGS. 9A to 9C. As the glass substrate on which the photoelectric transducers and so forth have been formed and the phosphor sheet, the same ones as those used in the first embodiment are used.

As shown in FIGS. 9A to 9C;

a) a glass substrate 701 having a groove-like cutout 705 along its periphery and on which the photoelectric transducers and so forth have been formed, an elastic member 707 to be provided in this cutout, and a phosphor sheet P' are made ready for use. As the elastic member, for example, a rubber type polymer is used. The cutout 705 is made in a width of, e.g., 1,000 μm and a depth of, e.g., 100 μm. This cutout 705 can be made using a precision laser cutter. In this cutout 705, the elastic member 707 is provided by, e.g., thick-film screen printing, followed by curing. It is formed in a thickness of, e.g., 500 μm. The photoelectric transducers and so forth are formed at the inner part surrounded by this cutout 705 which forms lamination edges. The phosphor sheet also has lamination edges with a like width. The size of the cutout and the size of the elastic member may be appropriately selected in accordance with conditions such as the width of the lamination edges and the extent of tolerance to which the finished phosphor sheet may deflect at its peripheral portion. (FIG. 9A)

b) Next, the glass substrate on which the photoelectric transducers and so forth have been formed and the phosphor sheet are set to their respective holders (not shown) in a vacuum chamber 805 standing open to the atmosphere. Here, the glass substrate and the phosphor sheet are previously registered (positionally adjusted) so that they can overlap one another well when brought into contact. The phosphor sheet has a base sheet comprised of a polyimide sheet, and hence it is carefully set to the holder to ensure its flatness.

In the present example, the polyimide sheet is used as the base sheet. A synthetic resin sheet such as a polyethylene sheet, capable of transmitting X-rays, may also be used. In order to improve utilization of light, a resin sheet may also be used on which aluminum has been deposited in a thickness of about 1,000 angstroms.

Use of a base sheet having an appropriate rigidity enables preferable close contact of the phosphor sheet by atmospheric pressure.

Thereafter, the vacuum chamber is evacuated by means of a vacuum pump (not shown). Then, the holders are moved so that the phosphor sheet is brought into close contact with the substrate on which the photoelectric transducers and so forth have been formed. While applying a pressure G to deform or crush the elastic member, they are contact-bonded. (FIG. 9B)

c) After cooling, they are taken out to the atmosphere, whereupon the phosphor sheet is pressed by the atmospheric pressure and brought into perfectly close contact with the surface of the substrate on which the photoelectric transducers and so forth have been formed. In this state, the phosphor sheet and the glass substrate on which the photoelectric transducers and so forth have been formed are sealed with a polyamide type thermoplastic resin 706 at their edge face portions to cover their interface. The thermoplastic resin includes vinyl acetate resins, acrylic resins, styrene resins, cellulose resins, polyamide resins, alkyd resins, and monomer type cyanoacrylate resins, any of which may be used to achieve the purpose of the present invention. (FIG. 9C)

In the present embodiment, the cutout 705 of the glass substrate has a free space serving as a lubricating portion, and any difference in thermal expansion between the phosphor sheet and the substrate can be completely absorbed.

Even when the cutout is not provided, the substrate may have such a structure that the elastic member can be provided on the substrate and the elastic member can effectively absorb the difference in thermal expansion, thus the effect of the present invention can be achieved using a simpler structure.

In the present embodiment, any deteriorated or damaged phosphor sheet can be detached with ease. When a material having no adhesive properties is used as the elastic member, the phosphor sheet can be peeled from the substrate with ease by only removing the sealing medium. The phosphor sheet tends to become scratched, and only the phosphor sheet, which is relatively inexpensive, may be changed for a new one if it has deteriorated because of exposure to X-rays as a result of long-term use. Thus, the radiation detector can be very economical.

Only a single vacuum chamber is employed as an apparatus used in the above steps. In actual manufacture, it is preferred to use an apparatus employing a plurality of vacuum chambers in combination. Holders may also be provided to be taken out of the vacuum chambers, and a plurality of phosphor sheets and a plurality of glass substrates having elastic members and on which the photoelectric transducers and so forth have been formed may be simultaneously set to the holders, which may be put into the vacuum chambers so that a plurality of sheets and substrates can be simultaneously processed.

Using the constitution and process of the present embodiment, large-area radiation detectors of 46 cm square were produced. As a result, the problems as previously stated did not occur.

THIRD EMBODIMENT

Figure 10:
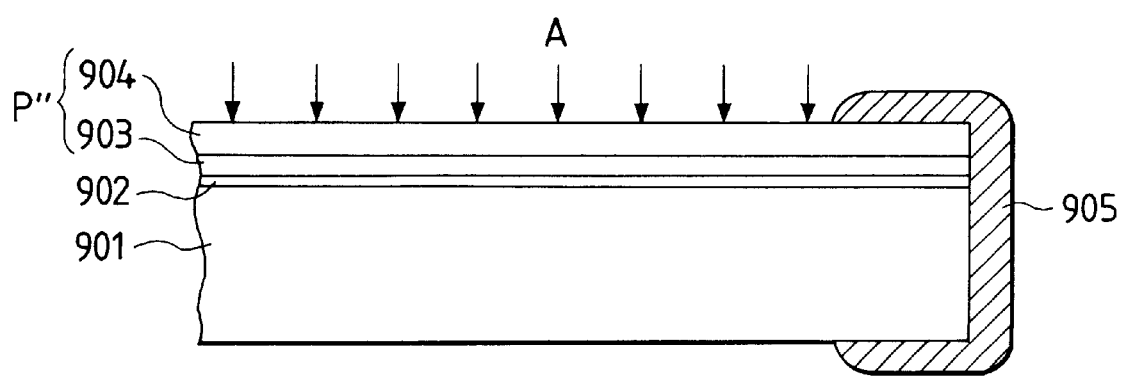

As a third embodiment of the radiation detector according to the present invention, FIG. 10 shows a partial diagrammatic cross-section of a two-dimensional radiation detector, which also illustrates edge face portions of the substrate and phosphor sheet. Reference numeral 901 denotes a glass substrate; 902, a layer of photoelectric transducers and so forth (the photoelectric transducers, thin-film transistors and so forth are omitted from the illustration); 903, a phosphor; 904, a base sheet of the phosphor; P'' (letter symbol), a phosphor sheet; and 905, a sealing medium. Letter symbol A denotes atmospheric pressure, which brings the phosphor sheet P'' into close contact with the surface of the layer of photoelectric transducers, and so forth.

According to the present embodiment, only a 5,000 angstroms thick protective layer is present between the phosphor and the photoelectric transducer, and the light produced in the phosphor can efficiently reach the photoelectric transducer. The phosphor sheet can also be brought into close contact with the surface of the layer of photoelectric transducers in precision within, e.g., 1 $\mu$m. The phosphor sheet and the glass substrate are both perfectly sealed with the sealing medium 905 at their whole edge face portions to better prevent outside moisture or the like from entering. Between the phosphor sheet P'' and the layer of photoelectric transducers and so forth, any impurity-containing component such as an adhesive is not present. Hence, not only the phosphor but also the underlying devices such as photoelectric transducers cause almost no deterioration.

The step of laminating the phosphor sheet to the substrate on which the photoelectric transducers and so forth have been formed and the subsequent steps, which are in accordance with the present embodiment, are shown in FIG. 11. In the present embodiment, all the steps are carried out in vacuum chambers.

FIG. 11 illustrates a load lock type production apparatus comprising three vacuum chambers A, B and C connected through gate valves G1, G2 and G3.

First, the glass substrate 901 on which the photoelectric transducers and so forth have been formed and the phosphor sheet P'' are made ready for use. These are the same as those used in the first embodiment, except that their lamination edges have a width of, e.g., 5 mm. The glass substrate 901 on which the photoelectric transducers and so forth have been formed and the phosphor sheet P'' are set to their respective holders (not shown) in a vacuum chamber A standing open to the atmosphere. Here, the glass substrate and the phosphor sheet are previously registered (positionally adjusted) so that they can overlap one another well when brought into contact. The phosphor sheet P'' has a base sheet comprised of a polyimide sheet, and hence it is carefully set to the holder to ensure its flatness.

In the present example also, the polyimide sheet is used as the base sheet. A synthetic resin sheet such as a polyethylene sheet, capable of transmitting X-rays, may also be used. In order to improve utilization of light, a resin sheet may also be used on which aluminum has been deposited in a thickness of about 1,000 angstroms.

Use of a base sheet having an appropriate rigidity enables preferable close contact of the phosphor sheet by atmospheric pressure.

Thereafter, the vacuum chamber is evacuated by means of a vacuum pump (not shown). Then, the holders are moved so that the phosphor sheet is brought into close contact with the substrate having photoelectric transducers and so forth. While applying a pressure, they are kept in pressure contact. (Vacuum Chamber A) Next, while the above substrate 901 and the phosphor sheet P" are kept in pressure contact, they are moved to the vacuum chamber B. In the vacuum chamber B, a dipping bath 1004 is provided, and a thermosetting epoxy resin having been vacuum-deaerated is put therein as a sealing medium 905. The thermosetting resin includes phenol resins, resorcinol resins, urea resins, melamine resins, furan resins, epoxy resins, unsaturated polyester resins and silicone resins, any of which may be used to achieve the purpose of the present invention. It is also preferable to use a thermoplastic resin capable of readily absorbing the difference in thermal expansion, i.e., having an elasticity. The thermoplastic resin includes vinyl acetate resins, acrylic resins, styrene resins, cellulose resins, polyamide resins, alkyd resins, and monomer type cyanoacrylate resins, any of which may be used to achieve the purpose of the present invention. The substrate 901 and phosphor sheet P" kept in pressure contact are set rotatable around a shaft (not shown) vertical to their surfaces. This shaft is also set to move up and down. First, the substrate 901 and phosphor sheet P" kept in pressure contact descend while their one-side edge faces are kept downward horizontal. Their edge face portions are dipped in the dipping bath. Thereafter, they are drawn up and the part dip-coated with resin is heated to effect curing. Thereafter, the substrate 901 and phosphor sheet P" are rotated by 90°, and the next edges faces are kept downward horizontal. Their edge face portions are dip-coated with resin and sealed in the same manner as the first edge face portions. This step is repeated for each remaining edge face portion.

Thereafter, the above substrate and phosphor sheet thus sealed are moved to the vacuum chamber C, where they are cooled. After cooling, they are taken out to the atmosphere, whereupon the phosphor sheet is pressed by the atmospheric pressure and brought into perfectly close contact with the surface of the substrate having photoelectric transducers and so forth. In the present embodiment, the purpose of the present invention can be achieved only by the sealing step, making the production process simple. Also, a large quantity of substrates with photoelectric transducers and so forth can be processed with ease.

In the present embodiment, the lamination of one set of the substrate and the phosphor sheet has been described. Holders may also be provided to be taken out of the vacuum chambers, and a plurality of phosphor sheets and a plurality of glass substrates on which the photoelectric transducers and so forth have been formed may be simultaneously set to the holders, which may be put into the vacuum chambers so that a plurality of sheets and substrates can be simultaneously processed. Also, in the foregoing, the edge face portions are sealed in the same vacuum chamber. Alternatively, a substrate having the photoelectric transducers and so forth and a phosphor sheet which are previously sealed at their three edge face portions may be put into the vacuum chambers so that they are brought into close contact by evacuation and then sealed with resin. Such a method may also be available. Either method may be appropriately employed taking account the number of materials to be processed and the scale of manufacture.

Using the constitution and process of the present embodiment, large-area radiation detectors 46 cm square were produced. As a result, the problems as previously stated did not occur at all.

As described above, according to the present invention, the substrate having the photoelectric transducers and so forth and the phosphor sheet are brought into close contact by atmospheric pressure substantially without providing any adhesive between them. Hence, the phosphor sheet can be free from cracking, the substrate can be free from deflection, the phosphor sheet can have a uniform flatness, and any impurities in the adhesive do not adversely affect phosphors and underlying devices. Also, the whole apparatus can be not heavy-weight, no useless gap may occur between the photoelectric transducer and the phosphor, a high utilization of light can be promised, and no blurred images due to scattering occur. Moreover, it is possible to accomplish a radiation detector having a high humidity resistance.

In other words, the present invention can effectively solve the various problems that may occur because of the use of adhesives and use of aluminum base sheets as conventionally used.

Thus, the employment of the constitution and process according to the present invention makes it possible to produce a large-area, compact and highly reliable radiation detector.

Incidentally, the resin for the sealing at the edge face portions and the thickness thereof may be selected so as not to cause the infiltration of air from edge faces, and preferably so as not to cause the infiltration of air at least within the lifetime of the phosphor. The thickness thereof may be appropriately determined in accordance with the resin to be used.

Needless to say, the present invention is by no means limited to the embodiments and drawings given above, and can be appropriately modified and combined within the purpose of the present invention.

What is claimed is:

1. A radiation detector comprising:
   a substrate having at least a plurality of photoelectric transducers, and a wavelength converter provided on the substrate;
   wherein the wavelength converter is brought into pressure contact with the substrate by atmospheric pressure and wherein edge face portions of the wavelength converter and the substrate, at least a part of a surface portion on the side of the wavelength converter and an interface portion between the wavelength converter and the substrate are covered with a sealing medium.

2. The radiation detector according to claim 1, wherein the wavelength converter has a material capable of wavelength conversion of incident radiations to a wavelength to which the photoelectric transducer is sensitive.

3. The radiation detector according to claim 2, wherein the material capable of wavelength conversion is provided on a base material.

4. The radiation detector according to claim 3, wherein the base material comprises a synthetic resin sheet.

5. The radiation detector according to claim 4, wherein the synthetic resin sheet is deposited with aluminum.

6. The radiation detector according to claim 1, wherein the wavelength converter comprises a phosphor.

7. The radiation detector according to claim 6, wherein the phosphor is provided on a base material.

8. The radiation detector according to claim 7, wherein the base material comprises a synthetic resin sheet.

9. The radiation detector according to claim 8, wherein the synthetic resin sheet is deposited with aluminum.

10. The radiation detector according to claim 1, wherein a close contact seal member is provided between a periphery of the wavelength converter and a periphery of the substrate.

11. The radiation detector according to claim 10, wherein the close contact seal member has an elasticity.

12. The radiation detector according to claim 1, wherein the substrate comes in direct contact with the wavelength converter.

13. A radiation detector comprising:
a substrate having at least a photoelectric transducer, and a phosphor sheet formed on the substrate by lamination;
wherein the phosphor sheet is brought into close contact with the substrate by atmospheric pressure and wherein an edge face of the phosphor sheet, at least a part of an edge portion of the substrate and an interface portion between the phosphor sheet and the substrate are provided with a sealing medium.

14. The radiation detector according to claim 13, wherein the sealing medium is provided at a peripheral portion of the phosphor sheet such that the sealing medium extends to at least a surface of the phosphor sheet opposite to the substrate side and wherein the phosphor sheet comprises a phosphor on a base sheet and said base sheet comprises a base member vapor-deposited with aluminum.

15. The radiation detector according to claim 14, wherein the base member is a synthetic resin sheet.

16. The radiation detector according to claim 13, wherein a close contact seal member is provided only at the peripheral portions of the substrate and the phosphor sheet and wherein the phosphor sheet comprises a phosphor on a base sheet and said base sheet comprises a base member deposited with aluminum.

17. The radiation detector according to claim 16, wherein the base member is a synthetic resin sheet.

18. The radiation detector according to claim 13, wherein the phosphor sheet has a base sheet comprising a synthetic resin sheet.

19. A process for producing a radiation detector, comprising the steps of:
preparing a substrate having at least a photoelectric transducer and a wavelength converter;
opposing a face of the substrate having at least a photoelectric transducer and a face of the wavelength converter under a pressure lower than atmospheric pressure;
while opposed, applying a sealing medium to edge face portions of the substrate and the wavelength converter inclusive of the interface between them to seal them; and
subsequently raising the substrate and the wavelength converter thus sealed to atmospheric pressure.

20. The process according to claim 19, which further comprises the step of providing a close contact seal member along the periphery of the substrate before the step of preparing the substrate having the photoelectric transducer and the wavelength converter.

21. The process according to claim 19, wherein the wavelength converter comprises a phosphor.

22. A process for producing a radiation detector formed by laminating a phosphor sheet to a substrate having at least a photoelectric transducer, comprising the steps of:
opposing a face of the substrate to a face of the phosphor sheet to be bonded under a pressure lower than atmospheric pressure; and
while maintaining the state where the faces of the substrate and the phosphor sheet are opposed to each other under atmospheric pressure, sealing edge face portions of the substrate and the phosphor sheet with a sealing medium, such that the sealing medium extends to at least a face of the phosphor sheet opposite to the substrate side.

23. The process according to claim 22, including the step of cooling after the sealing step.

24. The process according to claim 22, wherein the phosphor sheet comprises a phosphor and a base member and wherein the phosphor is disposed on the substrate side.

25. A process for producing a radiation detector formed by laminating a phosphor sheet to a substrate having at least a photoelectric transducer, comprising the steps of:
laminating the phosphor sheet and the substrate;
placing the phosphor sheet and substrate thus laminated under a pressure lower than atmospheric pressure; and
providing a sealing medium at peripheral portions of the phosphor sheet and substrate thus laminated, the phosphor sheet comprising a phosphor and base member, the phosphor being disposed on the substrate side.

26. The process according to claim 25, wherein the phosphor sheet comprises a base member and a phosphor provided on the base member and wherein the phosphor is provided on a side of the phosphor sheet where the phosphor sheet is laminated to the substrate.

27. The process according to claim 25, wherein the base member is deposited with aluminum.

28. A process for producing a radiation detector formed by laminating a phosphor sheet to a substrate having at least a photoelectric transducer, comprising the steps of:
bringing one surface of the phosphor sheet into contact with one surface of the substrate to effect lamination;
sealing the phosphor sheet and substrate thus laminated, by imparting a sealing medium to at least part of the peripheral portions of the phosphor sheet and the substrate;
drawing a vacuum after the sealing step; and
finally sealing the resulting phosphor sheet and substrate by imparting a sealing medium to the remaining whole of the peripheral portions; and employing a phosphor sheet comprising a phosphor and a base member wherein the phosphor is disposed on the substrate side.

29. The process according to claim 26, wherein the phosphor sheet comprises a base member and a phosphor provided on the base member and wherein the phosphor is provided on a side of the phosphor sheet where the phosphor sheet is in contact with the substrate.

30. A radiation detector comprising: a substrate having at least a photoelectric transducer, and a wavelength converter provided on the substrate;
the wavelength converter being brought into pressure contact with the substrate by atmospheric pressure wherein a close contact seal member is provided between a periphery of the wavelength converter and a periphery of the substrate and the close contact seal member is provided in a depression along the periphery of the substrate.

31. A radiation detector comprising: a substrate having at least a photoelectric transducer, and a wavelength converter provided on the substrate;
the wavelength converter being brought into pressure contact with the substrate by atmospheric pressure wherein a close contact seal member is provided between a periphery of the wavelength converter and a periphery of the substrate and wherein the close contact seal member (i) has an elasticity and (ii) comprises a thermosetting resin.

32. A radiation detector comprising: a substrate having at least a photoelectric transducer, and a wavelength converter provided on the substrate;

the wavelength converter being brought into pressure contact with the substrate by atmospheric pressure wherein a close contact seal member is provided between a periphery of the wavelength converter and a periphery of the substrate in a depression formed along the periphery of the substrate and wherein the close contact seal member comprises a thermosetting resin.

33. A radiation detector comprising: a substrate having at least a photoelectric transducer, and a wavelength converter provided on the substrate;

the wavelength converter being brought into pressure contact with the substrate by atmospheric pressure and wherein a sealing medium is provided at edge face portions of the substrate and the wavelength converter, inclusive of the interface between them.

34. A radiation detector comprising: a substrate having at least a photoelectric transducer, and a wavelength converter provided on the substrate;

the wavelength converter being brought into pressure contact with the substrate by atmospheric pressure, wherein a sealing medium is provided at edge face portions of the substrate and the wavelength converter, inclusive of the interface between them and wherein the sealing medium comprises a thermoplastic resin.

35. A radiation detector comprising: a substrate having at least a photoelectric transducer, and a phosphor sheet formed on the substrate by lamination, wherein;

the phosphor sheet is brought into close contact with the substrate at their interface by atmospheric pressure and wherein the phosphor sheet and substrate brought into close contact with each other are sealed with a sealing medium at their peripheral portions.

36. The radiation detector according to claim 35, wherein the phosphor sheet comprises a phosphor and a base member and the base member is a synthetic resin sheet.

37. A radiation detector comprising: a substrate having at least a photoelectric transducer, and a phosphor sheet formed on the substrate by lamination, wherein;

the phosphor sheet is brought into close contact with the substrate at their interface by atmospheric pressure, wherein a close contact seal member is provided only at a peripheral portions of the substrate and the phosphor sheet, and wherein the close contact seal member comprises a thermosetting resin.

38. A radiation detector comprising: a substrate having at least a photoelectric transducer, and a phosphor sheet formed on the substrate by lamination, wherein the phosphor sheet is brought into close contact with the substrate at their interface by atmospheric pressure, wherein a close contact seal member is provided only at peripheral portions of the substrate and the phosphor sheet, and wherein the close contact seal member comprises an elastic member.

39. A radiation detector comprising: a substrate having at least a photoelectric transducer, and a phosphor sheet formed on the substrate by lamination, wherein;

the phosphor sheet is brought into close contact with the substrate at their interface by atmospheric pressure, wherein a close contact seal member is provided only at peripheral portions of the substrate and the phosphor sheet, wherein the close contact seal member comprises an elastic member, and wherein the elastic member is provided in a cutout made along a periphery of the substrate.

40. The radiation detector according to claim 39, wherein the elastic member is provided to have a free space so as to be movable inside the cutout.

41. A process for producing a radiation detector, comprising the steps of:

contacting a substrate having at least a photoelectric transducer with a wavelength converter under a pressure lower than atmospheric pressure;

while maintaining the contact between the substrate and the wavelength converter, sealing the substrate and the wavelength converter at their edge face portions inclusive of the interface between them with a thermoplastic resin; and subsequently bringing the substrate and wavelength converter thus sealed to atmospheric pressure.

42. A process for producing a radiation detector, comprising the steps of:

contacting a substrate having at least a photoelectric transducer with a wavelength converter under a pressure lower than atmospheric pressure;

while maintaining the contact between the substrate and the wavelength converter, sealing the substrate and the wavelength converter at their edge face portions inclusive of the interface between them with using a thermoplastic resin; and subsequently bringing the substrate and wavelength converter thus sealed to atmospheric pressure, wherein the sealing step is conducted by dipping.

43. A process for producing a radiation detector, comprising the steps of:

(a) forming a depression along a periphery of a substrate;

(b) providing a close contact seal member along the periphery of the substrate;

(c) contacting the substrate having at least a photoelectric transducer with a wavelength converter under a pressure lower than atmospheric pressure;

(d) while maintaining the contact between the substrate and the wavelength converter, sealing the substrate and the wavelength converter at their edge face portions inclusive of the interface between them; and (e) bringing the substrate and wavelength converter thus sealed to atmospheric pressure.

44. A process for producing a radiation detector, comprising the steps of:

providing a close contact seal member comprising a thermosetting resin along a periphery of a substrate;

contacting the substrate having at least a photoelectric transducer with a wavelength converter under a pressure lower than atmospheric pressure;

while maintaining the contact between the substrate and the wavelength converter, sealing the substrate and the wavelength converter at their edge face portions inclusive of an interface between them; and bringing the substrate and wavelength converter thus sealed to atmospheric pressure.

45. A process for producing a radiation detector comprises the steps of:

laminating a substrate having at least a photoelectric transducer to a phosphor sheet; and sealing the phosphor sheet and substrate thus laminated, by imparting a sealing medium to at least part of peripheral portions of the phosphor sheet and the substrate; wherein at least one of the steps is carried out in a vacuum chamber under a pressure lower than atmospheric pressure.

46. The process according to claim 45, including employing as the phosphor sheet a phosphor and a base member, wherein the base member is deposited with aluminum.

47. A process for producing a radiation detector which comprises the steps of:
  contacting one surface of a substrate having at least a photoelectric transducer with one surface of a phosphor sheet to effect lamination;
  sealing the phosphor sheet and substrate thus laminated by imparting a sealing medium to at least part of peripheral portions of the phosphor sheet and the substrate;
  drawing a vacuum after the sealing step; and
  finally sealing the resulting phosphor sheet and substrate by imparting a sealing medium to the remaining whole of the peripheral portions.

48. The process according to claim 47, including employing as the phosphor sheet a phosphor and a base member, wherein the base member is deposited with aluminum.

49. A process for producing a radiation detector, comprising of steps of:
  providing a close contact elastic seal member along a periphery of a substrate having at least a photoelectric transducer;
  contacting the substrate with a wavelength converter under a pressure lower than atmospheric pressure;
  while maintaining the contact between the substrate and the wavelength converter, sealing the substrate and the wavelength converter at edge face portions inclusive of an interface between them; and
  bringing the substrate and wavelength converter thus sealed to atmospheric pressure.

50. A process for producing a radiation detector comprising the steps of:
  preparing a wavelength converter and a substrate having at least a photoelectric transducer;
  opposing a face of the substrate having at least a photoelectric transducer and a face of the wavelength converter under a second pressure equal to or lower than atmospheric pressure;
  while opposed, providing a sealing medium to edge face portions of the substrate and the wavelength converter inclusive of an interface between them to seal them; and
  placing the substrate and wavelength converter thus sealed under a pressure higher than the second pressure.

51. The process according to claim 50, wherein the edge face portions of the substrate and the wavelength converter inclusive of the interface between them are sealed with a thermosetting resin.

52. The process according to claim 50, wherein the edge face portions of the substrate and the wavelength converter inclusive of the interface between them are sealed by dipping.

53. The process according to claim 50, further comprising providing a close contact seal member along the periphery of the substrate before the wavelength converter is opposed to the substrate.

54. The process according to claim 53, further comprising forming a depression along the periphery of the substrate before the close contact seal member is provided.

55. The process according to claim 53, wherein the close contact seal member comprises a thermosetting resin.

56. The process according to claim 50, wherein the wavelength converter comprises a phosphor.

57. The process according to claim 50, wherein the second pressure is atmospheric pressure.

58. The process according to claim 50, wherein the wavelength converter is provided on a base member.

59. A process for producing a radiation detector comprising a substrate having at least a photoelectric transducer and a wavelength converter provided on the substrate, comprising the steps of:
  providing a resin on the substrate;
  laminating the substrate provided with the resin and the wavelength converter under atmospheric pressure such that the resin and the wavelength converter are brought into contact with each other; and
  bringing the resin and the wavelength converter thus laminated to a pressure lower than atmospheric pressure.

60. The process according to claim 59, which further comprises heating the resin under the pressure lower than atmospheric pressure.

61. The process according to claim 60, wherein the heating is carried out while applying pressure.

62. The process according to claim 61, wherein the resin is a sealing medium.

63. The process according to claim 62, wherein the sealing medium is vacuum-deaerated under the pressure lower than atmospheric pressure.

64. The process according to claim 60, wherein the resin is a sealing medium.

65. The process according to claim 64, wherein the sealing medium is vacuum-deaerated under the pressure lower than atmospheric pressure.

66. The process according to claim 59, wherein the resin is a sealing medium.

67. The process according to claim 66, wherein the sealing medium is vacuum-deaerated under the pressure lower than atmospheric pressure.

68. The process according to claim 59, wherein the resin comprises a thermosetting resin.

69. The process according to claim 59, which further comprises sealing edge face portions of the substrate and the wavelength converter with a sealing medium.

70. A process for producing a radiation detector comprising a substrate having at least a photoelectric transducer and a wavelength converter provided on the substrate, comprising the steps of:
  laminating the wavelength converter on the substrate via an elastic member under atmospheric pressure; and
  contact-bonding the substrate and the wavelength converter thus laminated under a pressure lower than atmospheric pressure.

71. The process according to claim 70, wherein the substrate is provided with a groove and the elastic member is provided in the groove.

72. The process according to claim 70, wherein the elastic member is deformed or crushed by contact-bonding.

73. The process according to claim 70, wherein the elastic member is a thick film.

74. The process according to claim 70, which further comprises sealing edge face portions of the substrate and the wavelength converter with a sealing medium.

75. A process for producing a radiation detector comprising a substrate having at least a photoelectric transducer and a wavelength converter provided on the substrate, comprising the steps of:

laminating the wavelength converter on the substrate under a pressure lower than atmospheric pressure; and subsequently providing a sealing medium at a region which comprises edge portions of the substrate and the wavelength converter, and part of a face of the wavelength converter opposite to the substrate side.

76. The process according to claim 75, wherein the sealing medium is provided under atmospheric pressure.

77. The process according to claim 75, wherein the sealing medium is provided under a pressure lower than atmospheric pressure.

* * * * *

UNITED STATES PATENT AND TRADEMARK OFFICE
CERTIFICATE OF CORRECTION

PATENT NO. : 6,121,620
DATED : September 19, 2000
INVENTOR(S) : Kazuaki Tashiro, et al.

It is certified that error appears in the above-identified patent and that said Letters Patent is hereby corrected as shown below:

Title Page:
Item [56] References Cited, under FOREIGN PATENT DOCUMENTS
"660421 A2 6/1995 European Pat. Off.." should be deleted.

Column 5:
Line 67, "well" should be deleted.

Column 7:
Line 53, "purport" should read -- purpose --.

Column 11:
Line 8, "A) Next," should read -- A) ¶Next, --.

Column 13:
Line 26, "vapor-deposited" should read -- deposited --.

Column 14:
Line 45, "claim 26," should read -- claim 28, --.

Column 15:
Line 49, "a" should be deleted.

Column 16:
Line 44, "the" should read -- an --.

Signed and Sealed this

Twenty-fifth Day of September, 2001

Attest:

NICHOLAS P. GODICI
*Attesting Officer* — *Acting Director of the United States Patent and Trademark Office*